(12) United States Patent   (10) Patent No.: US 7,196,775 B2
Galburt   (45) Date of Patent: Mar. 27, 2007

(54) PATTERNED MASK HOLDING DEVICE AND METHOD USING TWO HOLDING SYSTEMS

(75) Inventor: Daniel N. Galburt, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 156 days.

(21) Appl. No.: 10/922,862

(22) Filed: Aug. 23, 2004

(65) Prior Publication Data

US 2006/0038973 A1 Feb. 23, 2006

(51) Int. Cl.
G03B 27/62 (2006.01)
G03B 27/42 (2006.01)

(52) U.S. Cl. .......................................... 355/75; 355/53

(58) Field of Classification Search ................. 355/75, 355/53; 250/548
See application file for complete search history.

(56) References Cited

U.S. PATENT DOCUMENTS 4,963,921 A 10/1990 Kariya et al.
5,847,813 A 12/1998 Hirayanagi
6,172,738 B1 1/2001 Korenaga et al.
2003/0179354 A1 9/2003 Araki et al.
2005/0128463 A1 6/2005 Ottens et al.

FOREIGN PATENT DOCUMENTS

EP 0 357 424 B1 10/1996

OTHER PUBLICATIONS

Search Report, dated Mar. 6, 2006, for Singapore Patent Appl. No. 200505332-7, 6 pages.
English-language Abstract for Japanese Patent Publication No. JP2002233984, 1 page, data supplied from the espacenet database.

*Primary Examiner*—Peter B. Kim
(74) *Attorney, Agent, or Firm*—Sterne, Kessler, Goldstein & Fox P.L.L.C.

(57) ABSTRACT

A system and method that eliminate or substantially reduce slippage of a pattern generator with respect to a pattern generator holding device during a scanning portion of an exposure operation. In first and second examples, this is done by either (a) continuously or (b) when needed concurrently using first and second pattern generator holding systems to hold the pattern generator to the pattern generator holding device. In these examples, the first pattern generator holding systems utilizes an electrostatic system to attract the pattern generator to the pattern generator holding device and the second pattern generator holding system utilizes a vacuum system to attract the pattern generator to the pattern generator holding device.

25 Claims, 7 Drawing Sheets

PATTERNED MASK HOLDING DEVICE AND METHOD USING TWO HOLDING SYSTEMS

BACKGROUND OF THE INVENTION

1. Field of the Invention

The present invention is related to a lithography system.

2. Background Art

Lithography systems are used to transfer a master pattern onto a substrate using an exposure process. Example lithography systems include, but are not limited to, reflective or transmissive maskless, immersion, and mask-based system. Example substrates include, but are not limited to, semiconductor wafers, flat panel display substrates, flexible substrates, and the like. Light interacting with a static or active pattern generator becomes patterned. This patterned light is projected using a projection optical system onto one or more target areas of the substrate during the exposure process to form features on the substrate.

In a masked-based system, the projection optics often reduce the size of the pattern projected on the substrate by a factor of 4 or more, thus making the mask easier to manufacture and inspect. Lithography systems that utilize patterned masks typically utilize a vacuum clamping device that both holds the mask in place during the exposure process and allows the mask to be quickly released and exchanged for another.

Lithography systems that simultaneous scan both the patterned mask and a substrate during the exposure process utilize stages to accelerate and decelerate the both the patterned mask and the substrate at the start and end of an exposure scan. To achieve higher throughputs, exposing speeds and accelerations have steadily increased to the point where the forces required to accelerate the patterned mask can cause slippage of the patterned mask with respect to the vacuum clamping device. Any unwanted movement of the patterned mask with respect to the substrate during acceleration, or otherwise, can cause errors to features patterned on the substrate.

Therefore, what is needed is a system and method that can be used to substantially reduce or eliminate slippage of a pattern generator with respect to a stage system that controls a position of the pattern generator during a scanning exposure process.

BRIEF SUMMARY OF THE INVENTION

An embodiment of the present invention provides a system comprising a pattern generator holding device, a first pattern generator holding system coupled to the pattern generator holding device that releasably couples a pattern generator to the pattern generator holding device, a second pattern generator holding system coupled to the pattern generator holding device, the second pattern generator holding system operating concurrently with the first pattern generator holding system to releasably couple the pattern generator to the pattern generator holding device, and a moving device couple to the pattern generator holding device that moves the pattern generator holding device and the pattern generator during a scanning portion of a exposure operation.

In one example, a detector monitors the pattern generator and a controller controls operation of the first and second pattern generator holding systems, such that the first and second pattern generator holding systems operate concurrently when the detector senses slippage of the pattern generator.

A further embodiment of the present invention provides a method comprising the steps of (a) holding a pattern generator to a pattern generator holding device using a first holding system and (b) holding the pattern generator to the pattern generator holding device using a second pattern generator holding system concurrently with step (a), while a moving device is moving the pattern generator holding device and the pattern generator during a scanning portion of an exposure operation.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate various embodiments of the present invention and, together with the description, further serve to explain the principles of the invention and to enable a person skilled in the pertinent art to make and use the invention.

Figure 5:
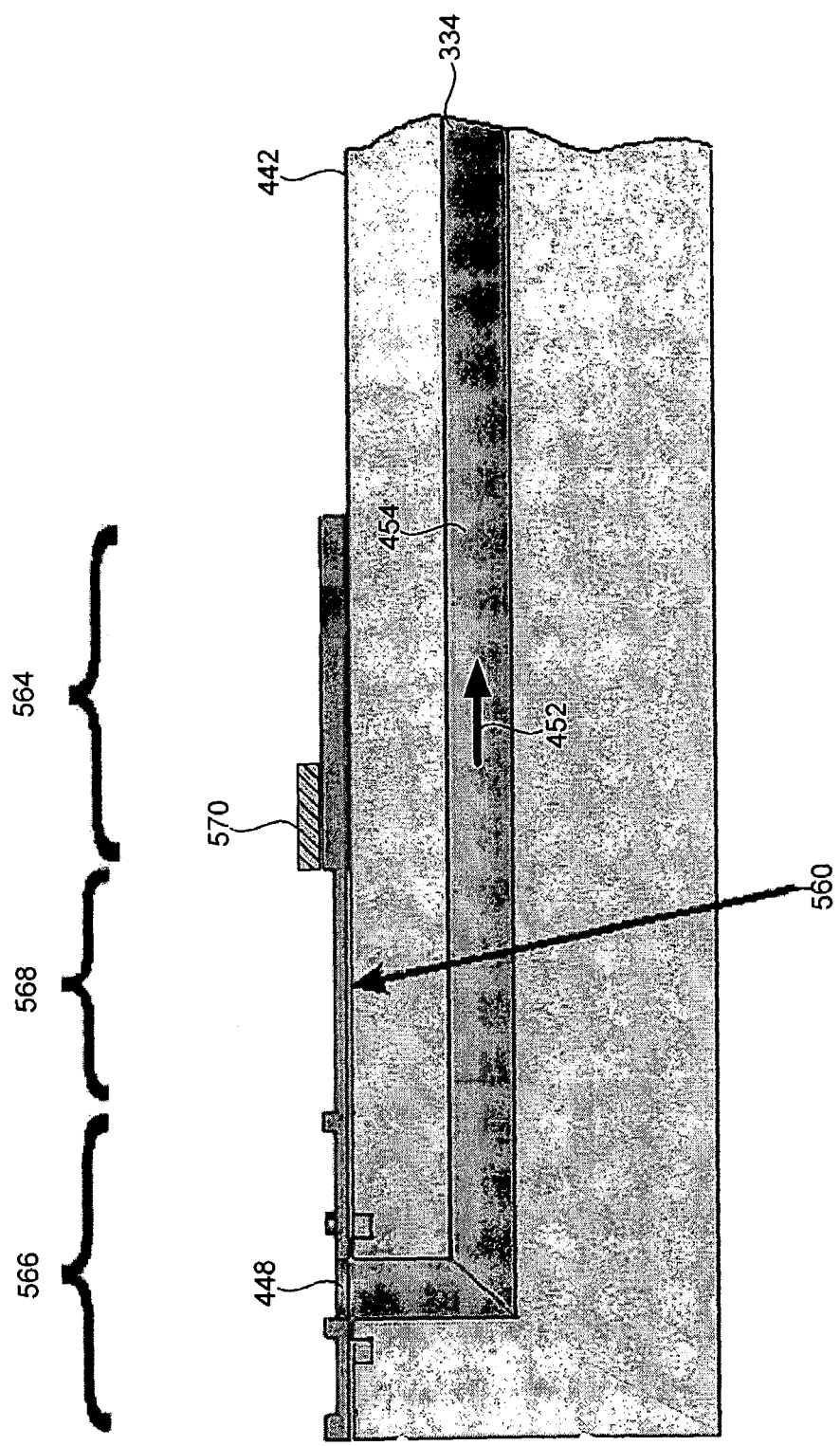
Figure 6:
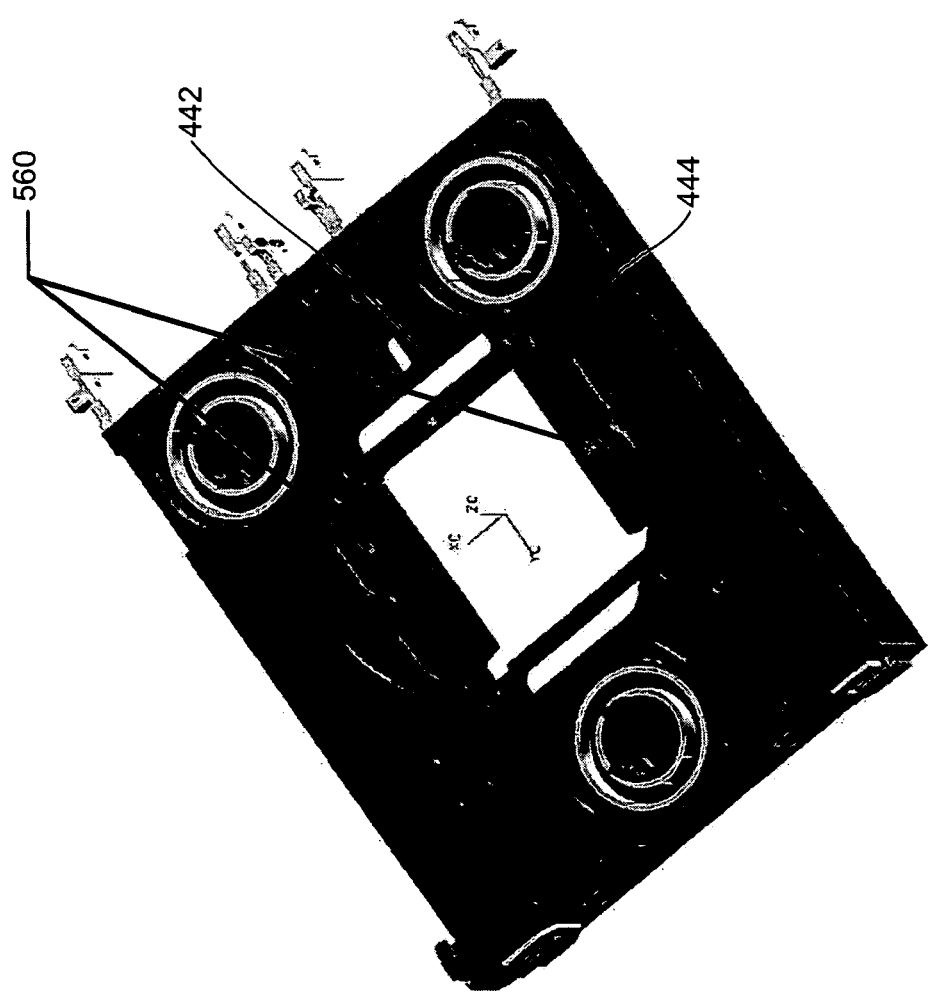
Figure 7:
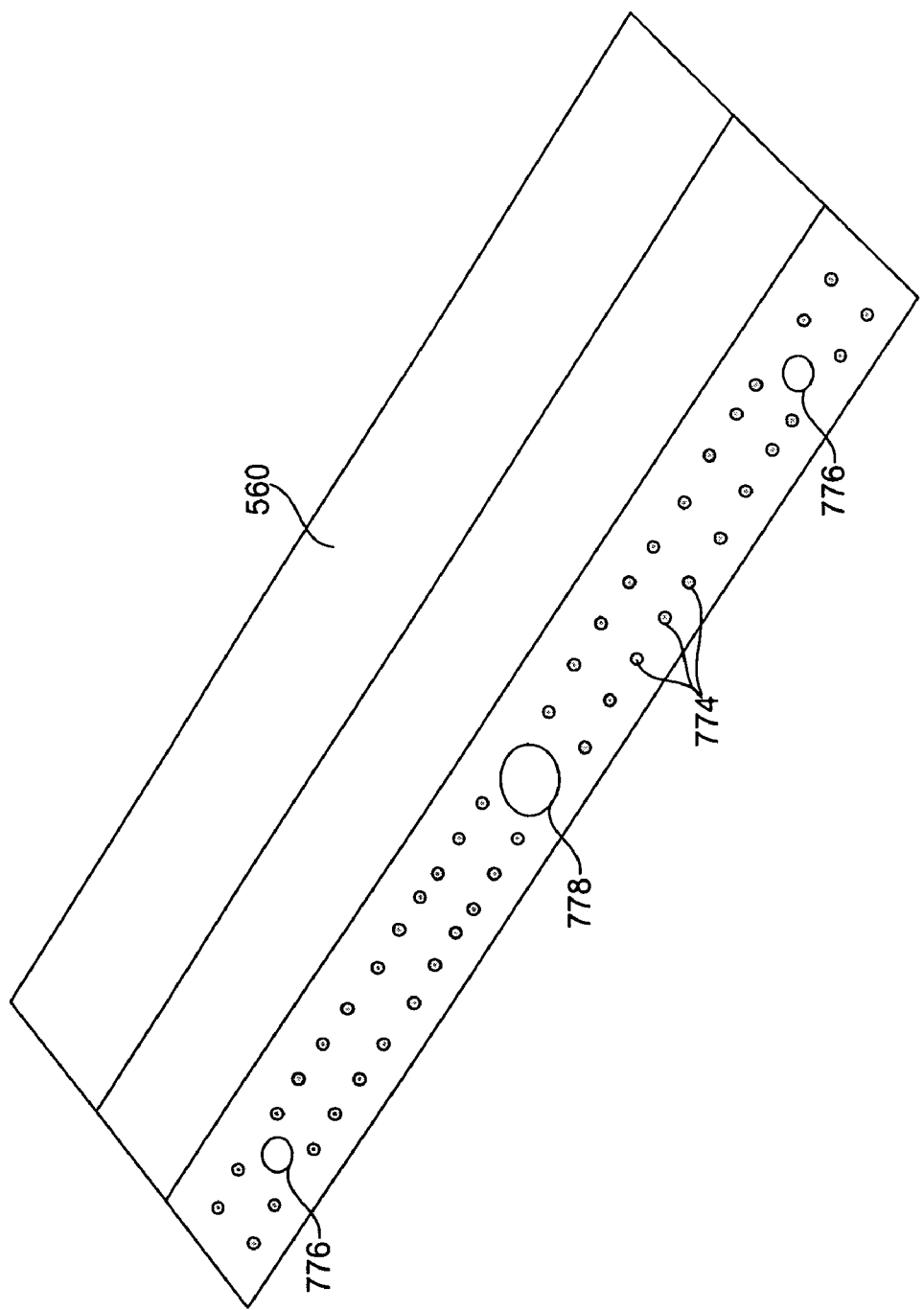

FIGS. 5, 6, and 7 show details of a pattern generator holding system, according to one embodiment of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

One or more embodiments of the present invention provide a system and method that eliminate or substantially reduce slippage of a pattern generator with respect to a pattern generator holding device during movement of the pattern generator and pattern generator holding device, e.g., during a scanning portion of an exposure operation. In first and second examples, this is done by either (a) continuously or (b) when needed concurrently using first and second pattern generator holding systems to hold the pattern generator to the pattern generator holding device.

In these examples, the first pattern generator holding systems utilizes an electrostatic system to attract the pattern generator to the pattern generator holding device and the second pattern generator holding system utilizes a vacuum system to attract the pattern generator to the pattern generator holding device.

In the example utilizing as-needed concurrent use of the first and second pattern generator holding systems, a monitoring device detects when the pattern generator is slipping with respect to the pattern generator holding device. Once slippage is detected, a controller enables both the first and second pattern generator holding systems.

In one example, through the use of two holding systems, hold down force can increase 40–50% or more compared to conventional systems using only one holding system, which adequately holds the pattern generator to the pattern generator holding device during increasingly faster accelerations and speeds of the pattern generator holding device. For example, accelerations of up to about 8 G's (gravitational forces of gravity) or more.

Terminology

Throughout the description, the use of the terms "contrast device," "pattern generator," and "pattern generating devices" includes a reflective and transmissive reticle, mask, liquid crystal display, spatial light modulator, grating light valve, digital mirror device, or any other active or passive device that can be used to impart a pattern onto a light beam, as will become apparent to one of ordinary skill in the art upon reading this description. In the examples discussed below, the pattern generator is physically scanned to expose a substrate.

Also, the use of "system" or "lithography system" is meant to include photolithography, direct write lithography, maskless lithography, immersion lithography, and the like.

The use of "light" or "radiation" is meant to include any wavelength desired for a particular application.

The use of "vacuum" within this application refers to a vacuum suction system that exerts enough suction on a pattern generator to hold the pattern generator against a clamp surface.

The use of "electrostatic" within this application refers to a system that produces an electric potential in a first device positioned proximate a second device, such that the first and second devices are attracted to one another.

Overview of Environment for a Lithography

As discussed above, during lithography, a substrate, which is disposed on a substrate stage, is exposed to an image (e.g., a pattern) formed by a pattern generator disposed on a pattern generator stage. In some example, an array of pattern generators can be used. The image is projected onto the substrate by projection optics located within a lithography apparatus. While projection optics are used in the case of lithography, a different type of exposure apparatus can be used depending on the particular application. For example, an excimer laser, x-ray, ion, electron, or photon lithography can each require a different exposure apparatus, as is known to those skilled in the art. The particular example of lithography is discussed here for illustrative purposes only.

Pattern generators are used in lithography systems to pattern light, which forms images that are used to form features on a substrate. Such substrates can include those used in the manufacture of flat panel displays (e.g., liquid crystal displays), circuit boards, various integrated circuits, and the like. A frequently used substrate for such applications is a semiconductor wafer or flat panel display glass substrate. While a portion this description is written in terms of a semiconductor wafer for illustrative purposes, one skilled in the art would recognize that this description also applies to other types of substrates known to those skilled in the art.

The projected image produces changes in the characteristics of a layer (e.g., photoresist) deposited on a surface of the substrate. These changes correspond to features in the image projected onto the substrate during exposure. Subsequent to exposure, the surface can be etched to produce a patterned layer. The pattern corresponds to the features projected onto the substrate during exposure. This patterned layer is then used to remove or further process exposed portions of underlying structural layers within the substrate, such as conductive, semiconductive, or insulative layers. This process is then repeated, together with other steps, until the desired features have been formed on the surface, or in various layers, of the substrate.

Step-and-scan technology works in conjunction with a projection optics system that has a narrow imaging slit. Rather than expose the entire substrate at one time with the image formed by the pattern generator, individual fields are scanned onto the substrate one at a time through an imaging slit. This is accomplished by moving a pattern formed by the pattern generator relative to the substrate, such that the imaging slot is moved across the field during the scan. The substrate stage is then stepped between field exposures to allow multiple copies of the pattern formed by the pattern generator to be exposed over the substrate layer. In this manner, the quality of the image projected onto the substrate is maximized.

Exemplary Lithography Systems in which the Present Invention is Practiced

Figure 1:
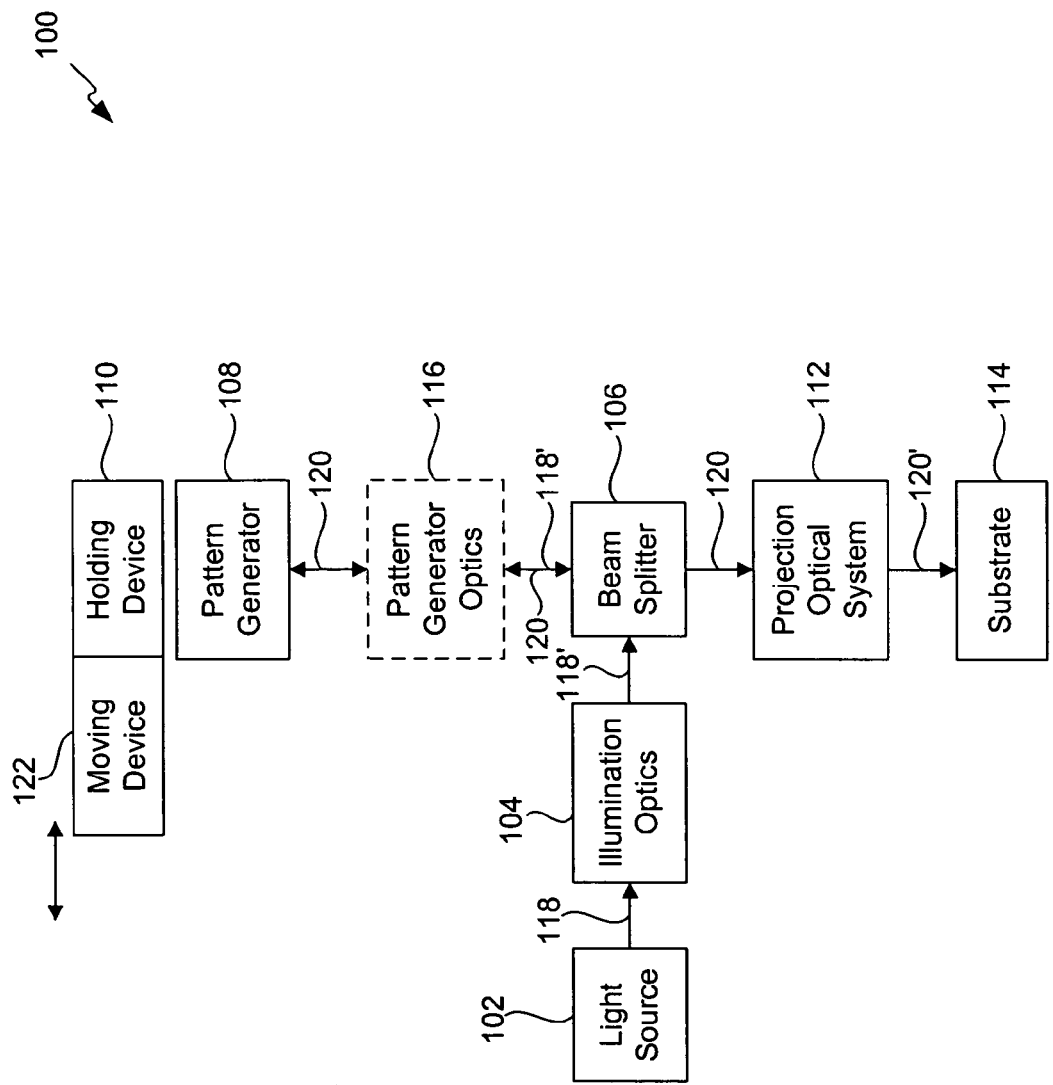
FIGS. 1 and 2 show exemplary lithography systems in which the present invention can be practiced.

FIG. 1 shows one exemplary lithography system 100 in which the present invention is practiced. System 100 includes a light source 102, illumination optics 104, beam splitter 106, pattern generator 108, holding device 110, projection optical system 112, and substrate 114. In one example, pattern generator optics 116 are placed between beam splitter 106 and pattern generator 108.

As briefly described above, a radiation beam 118 from light source 102 is processed using illumination optics 104 before a processed radiation beam 118' is directed onto beam splitter 106. Processing of radiation beam 118 can include expanding, homogenizing, focusing, or any other optical manipulation of radiation beam 118, as would become apparent to one of ordinary skill in the art upon reading this description.

Beam splitter directs beam 118' towards pattern generator 108, which forms a patterned beam 120 that is directed onto substrate 114 after beam 120 is processed in projection optical system 112 to form beam 120'.

A moving device 122 of system 100 is coupled to holding device 110 and pattern generator 108. In one example, moving device 122 is a stage that moves in the directions of the arrows. Moving device 122 is used to scan holding device 110 and pattern generator 108 during an exposure operation. As is known to a skilled artisan, moving device 122 moves during an exposure process to expose an entire area of substrate 114. As throughput requirements become higher, scanning speeds and acceleration become larger, which requires a high hold down force of holding device 110 on pattern generator 108 and/or a greater friction between pattern generator 108 and holding device 110. This is accomplished through embodiments of the present invention described in more detail below.

Second Exemplary Lithography System in which the Present Invention is Practiced

Figure 2:
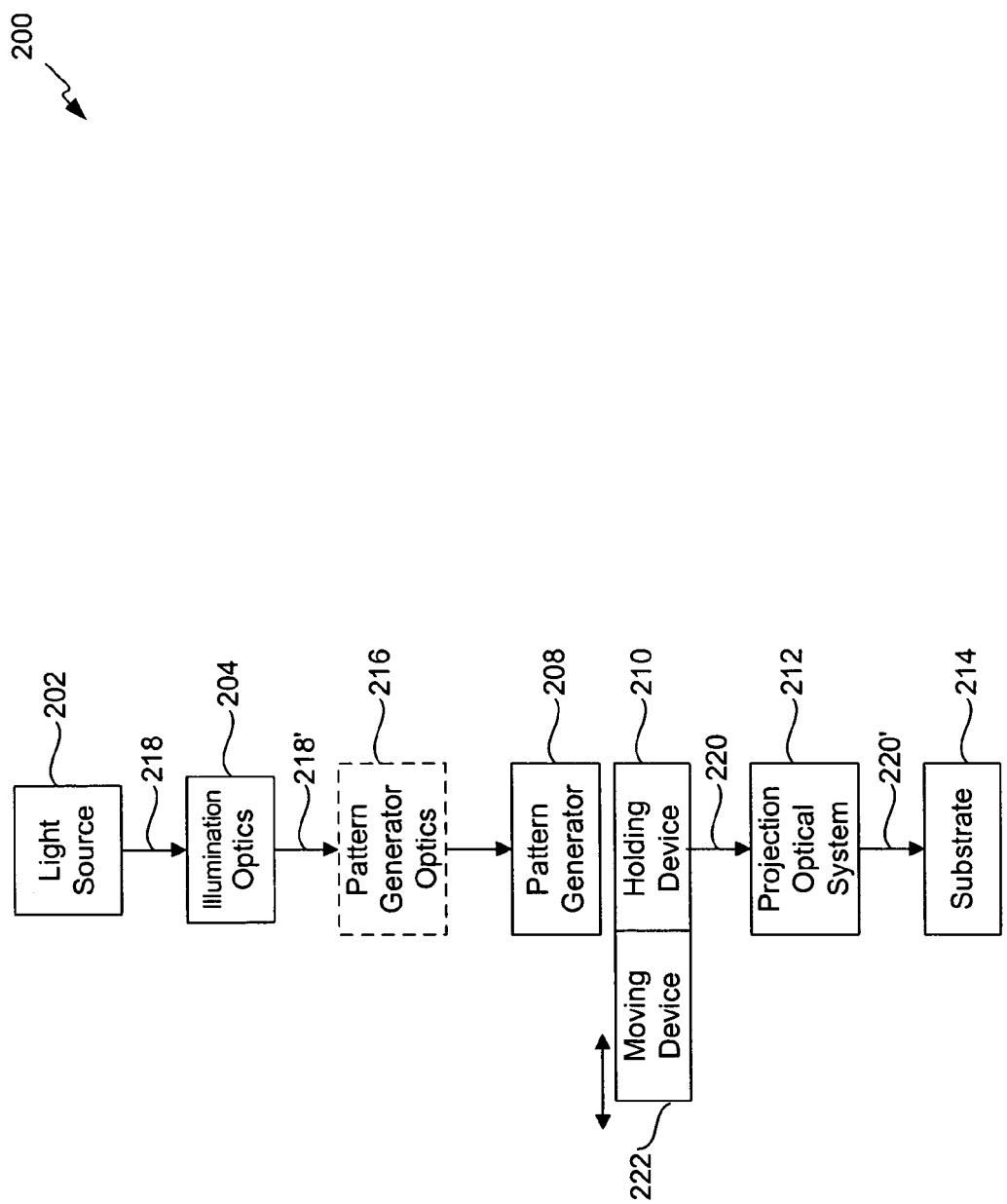

FIG. 2 shows one exemplary lithography system 200 in which the present invention is practiced. System 200 includes a light source 202, illumination optics 204, pattern generator 208, holding device 210, projection optical system 212, and substrate 214. In this example, pattern generator 208 is a transmissive pattern generator.

In one example, pattern generator 208 is a transmissive pattern mask (or reticle) in a mask-based scanning lithography system.

As briefly described above, a radiation beam 218 from light source 202 is processed using illumination optics 204 before a processed radiation beam 218' is directed towards pattern generator 208. Processing of radiation beam 218 can include expanding, homogenizing, focusing, or any other optical manipulation of radiation beam 218 as would become apparent to one of ordinary skill in the art upon reading this description. Pattern generator 208 forms a patterned beam 220 that is directed onto substrate 214 after beam 220 is processed in projection optical system 212 to form beam 220'.

A moving device 222 of system 200 is coupled to holding device 210 and pattern generator 208. In one example, moving device 222 is a stage that moves in the directions of the arrows. Moving device 222 is used to scan holding device 210 and pattern generator 208 during an exposure operation. As is known to a skilled artisan, moving device 222 moves during an exposure process to expose an entire area of substrate 214. As throughput requirements become higher, scanning speeds and acceleration become larger, which requires a high hold down force of holding device 210 on pattern generator 208 and/or a greater friction between pattern generator 208 and holding device 210. This is accomplished through embodiments of the present invention described in more detail below.

Exemplary Pattern Generator Holding Device

Figure 3:
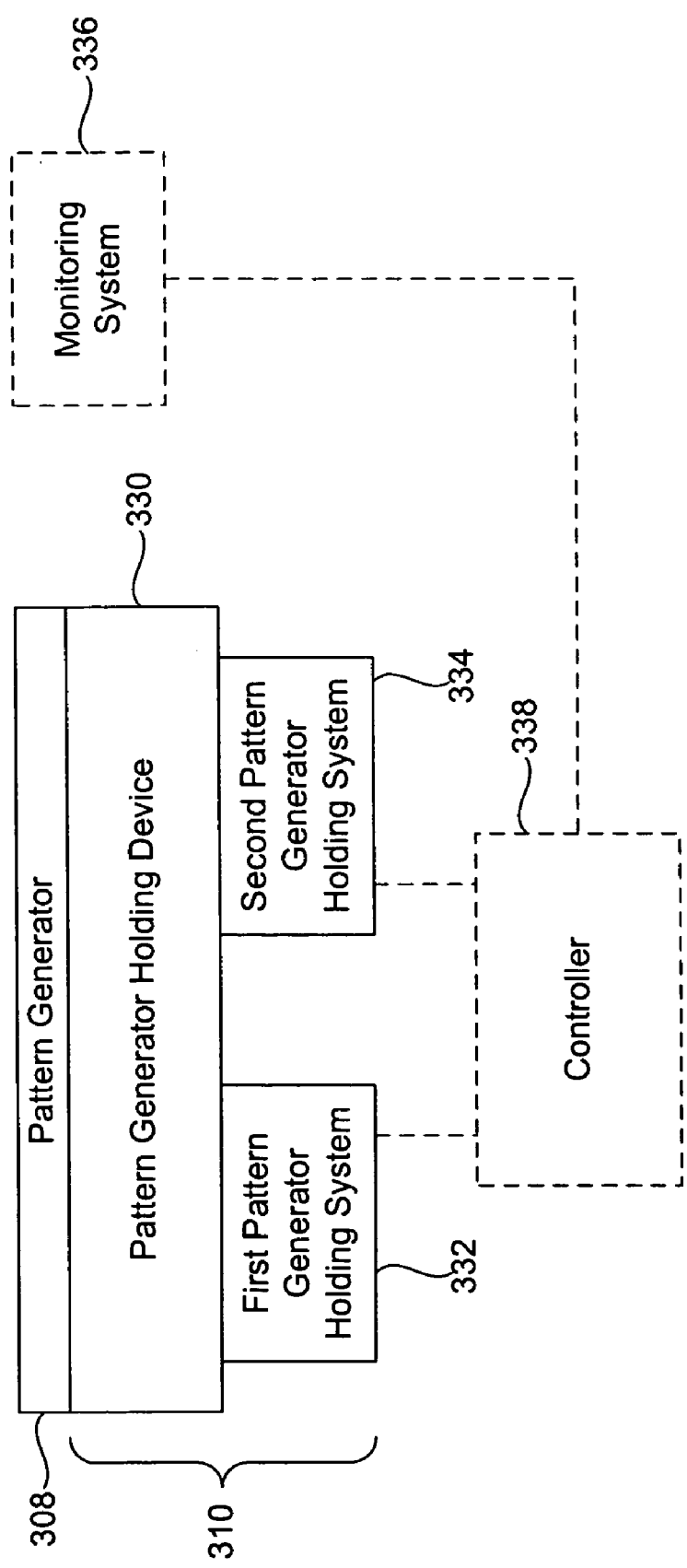
FIG. 3 is a block diagram of a section of the lithography system, according to one embodiment of the present invention.

FIG. 3 shows a block diagram of a section of a lithography system (not shown), according to one embodiment of the present invention. The section includes a pattern generator 308 and a holding device 310. In this embodiment, holding device 310 includes a pattern generator holding device 330 and first and second pattern generator holding systems 332 and 334, respectively.

In one example, first and second pattern generator holding systems 332 and 334 operate concurrently during an entire range of movement of pattern generator holding device 330. This is done to eliminate or substantially reduce slippage of pattern generator 308 on pattern generator holding device 330 during high acceleration of pattern generator holding device 330. For example, acceleration up to about 8 G's (gravitational pulls), or more. Through use of both first and second pattern generator holding systems 332 and 334, a holding force securing pattern generator 308 to pattern generator holding device 330 is significantly increased over using one pattern generator holding system. For example, as discussed above, the force can be increased 40–50%, which also increases frictional force between pattern generator 308 and holding device 310

In another example, an optional monitoring system 336 and control system 338 are coupled to the first and second generator holding systems 332 and 334. In this example, monitoring system 336 monitors any movement (e.g., slippage) of pattern generator 308 with respect to patter generator holding device 330. Also, in this example, concurrent operation of first and second pattern generator holding systems 332 and 334 is only fully operational or enabled when slippage is detected.

Figure 4:
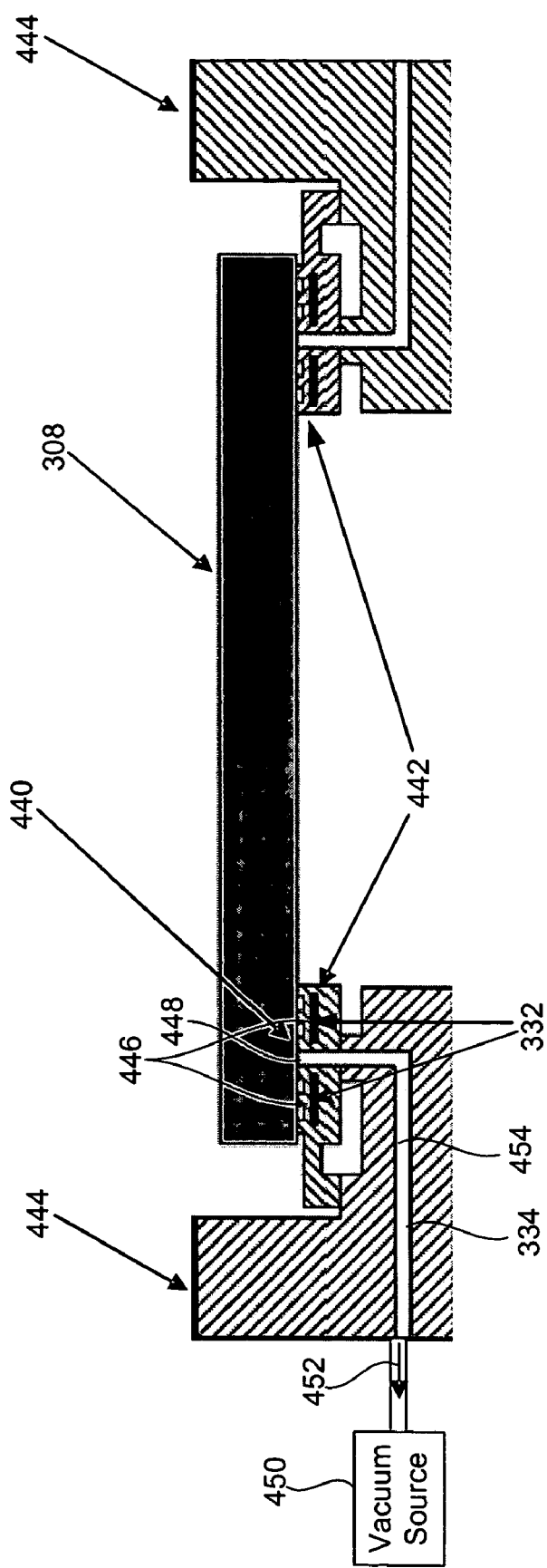
FIG. 4 is a schematic diagram of the section of the lithography system of FIG. 3, according to one embodiment of the present invention.

FIG. 4 shows an exemplary schematic diagram of the section of the lithography system shown in FIG. 3, according to one embodiment of the present invention. A surface 440 of pattern generator 308 is secured to a chuck 442 coupled to a stage 444. In this embodiment, first pattern generator holding system 332 is an electrostatic system and second pattern generator system 334 is a vacuum system. Both systems interact with surface 440 of pattern generator 308 to hold pattern generator 308 against chuck 442 during initial securing and continued securing of pattern generator 308.

In one example, chuck 442 can be made from a zero expansion glass material, a ceramic material, Zerodur®, or the like. Depending on an application's requirements, chuck 442 can be either flexible or rigid.

Exemplary First Pattern Generator Holding System

As discussed above, first pattern generator holding system 332 includes one or more electrodes 446, which are biased to cause an attractive electronic potential between electrodes 446 and surface 440. In one example, electrodes 446 can be placed within chuck 442. In another example, electrodes 446 can be placed on top of chuck 442. If electrodes 446 are placed on top of chuck 442, they might be coated in order to eliminate or substantially reduce leakage, which is normally unnecessary when electrodes 446 are placed within chuck 442.

In one example, a limit to electrostatic clamping in air is determined by a breakthrough voltage through a gap between electrode 446 and surface 440. No matter how high a voltage is on electrodes 446, if at a lower voltage the breakthrough voltage over the air gap is reached, then the clamping will not perform any better than as if that lower voltage was being used.

In one example, a maximum clamping force is about 0.3–0.5 bar. The clamping pressure (p_clamp) is directly related to electric field (Egap) in the gap with the following relationship:

$$Egap = sqrt(p\_clamp*2/e0)$$

With e0 the dielectric constant. A voltage (Vgap) over the gap is simply the electric field times the gap:

$$Vgap = Egap*dgap$$

With dgap the height of the gap. Thus, in this example with a breakthrough voltage of about 300 V (in dry air) a maximum gap of about 3.5 μm (for 0.3 bar) or about 2.8 μm (for 0.5 bar) is required. The voltage on electrodes 446 is then dependent on the ratio between the gap and the dielectric's thickness and constant, but will typically stay below about 3 kV levels for 100 μm thick Zerodur®.

In one example, when a reticle or mask is used as pattern generator 308, surface 440 includes a chrome pattern layer. The chrome is attracted to the potential generated by biasing electrodes 446.

Exemplary Second Pattern Generator Holding System

In one example, second pattern generator holding system 334 uses a vacuum suction or hold down force formed between surface 440 and one or more ends 448. This is done using a vacuum source 450 that causes suction in the direction of arrow 452 through vacuum line 454. In one example, a quick release of pattern generator 308 is desired, so vacuum source can also reverse flow and push out on surface 440 pattern generator 308 through end 448.

It is to be appreciated that, although on a certain portion of surface 440 is shown to be interacting with first and second pattern generator holding systems 332 and 334, any amount of surface 440 can interact with these systems. Thus, in one example more complicated vacuum lines can be employed.

FIGS. 5, 6, and 7 show details of second pattern generator holding system 334, according to one embodiment of the present invention. In this embodiment, a membrane 560 is coupled to chuck 442. Membrane 560 is used to spread vacuum suction over a greater surface area of pattern surface 440, which helps to perform vacuum suction through small gaps as was discussed above.

In various examples, instead of electrode 446 being held by chuck 442, they could be coupled to or inserted within membrane 560. In other examples, membrane 560 can include a metallic or similar coating that also attracts to an electric potential generated by electrode 446.

In one example, the spreading of vacuum suction is done by configuring membrane 560 to be porous or have various openings or holes 774 (see FIG. 7).

In another example, the spreading of vacuum suction is done using channels or grooves in membrane 560 that direct vacuum suction to various portions of pattern generator 308.

In either example, vacuum suction occurs through ends 448, and is spread using the physical characteristics of membrane 560.

Membrane 560 is coupled to chuck 442 at portion 564, is coupled to end 448 at portion 566, and is uncoupled at portion 568. Pattern generator 308 is "clamped" or secured to chuck 442 via membrane 560 substantially in area 556. Optionally, a contact 570 can be coupled to membrane 560 in order to ground pattern generator 308, if that is necessary.

Thus, through use of both electrostatic force exerted by electrostatic system 332 and vacuum hold down force exerted by vacuum system 334 a higher overall hold down force is placed on pattern generator 308 resulting in a higher friction force between pattern generator 308 and holding device 310 keeps pattern generator 308 from sliding on holding device 310 during increasingly higher levels of acceleration, e.g., up to 8 G's or above.

FIG. 6 is a perspective view showing a configuration of stage 444, chuck 442, and membrane 560, according to one embodiment of the present invention, when no pattern generator is coupled to the section of the lithography system.

FIG. 7 shows membrane 560, according to one embodiment of the present invention. In this embodiment, membrane 560, along with holes 774, includes openings or areas 776 that are proximate with ends 448 (FIG. 4) of second pattern generator holding system 334 (FIG. 4) and areas 778 that are used to align membrane 560 with respect to chuck 442.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system, comprising,
   a patterned mask holding device;
   a first patterned mask holding system coupled to the patterned mask holding device that releasably couples a patterned mask to the patterned mask holding device;
   a vacuum patterned mask holding system coupled to the patterned mask holding device, the vacuum patterned mask holding system operating concurrently with the first patterned mask holding system to releasably couple the patterned mask to the patterned mask holding device;
   a membrane coupled to the patterned mask holding device, the membrane being configured to spread vacuum suction from the vacuum patterned mask holding system across a surface area of the patterned mask; and
   a moving device coupled to the patterned mask holding device that moves the patterned mask holding device and the patterned mask during a scanning portion of an exposure operation.

2. The system of claim 1, wherein the first patterned mask holding system comprises an electrostatic system.

3. The system of claim 2, wherein the membrane includes a metallic coating configured to attract an electric potential generated by the electrostatic system.

4. The system of claim 1, wherein:
   the moving device comprises a stage; and
   the patterned mask holding device comprises a chuck coupled to the stage and the patterned mask.

5. The system of claim 4, wherein the chuck is made from zero expansion glass, Zerodur®, or ceramic materials.

6. The system of claim 1, further comprising:
   a detector that monitors the patterned mask; and
   a controller that controls operation of the first and vacuum patterned mask holding systems, such that the first and vacuum patterned mask holding systems operate concurrently when the detector senses slippage of the patterned mask.

7. The system of claim 1, wherein the moving device moves the patterned mask holding device and the patterned mask at an acceleration of up to 8 G's.

8. The system of claim 1, wherein the membrane is porous.

9. The system of claim 1, wherein the membrane includes channels or grooves configured to be used to spread the vacuum suction from the vacuum patterned mask holding system across the surface area of the patterned mask.

10. The system of claim 1, further comprising:
    a grounding contact coupled to the membrane that is configured to ground the patterned mask.

11. The system of claim 1, wherein the membrane includes alignment devices configured to align the membrane with respect to the patterned mask holding device.

12. A system, comprising,
    a patterned mask holding device that holds a patterned mask;
    a monitoring system that monitors slippage of the patterned mask with respect to the patterned mask holding device during movement of the patterned mask holding device, the monitoring system producing a result signal when the slippage is detected;
    a first patterned mask holding system coupled to the patterned mask holding device that releasably couples the patterned mask to the patterned mask holding device;

a vacuum patterned mask holding system coupled to the patterned mask holding device that releasably couples the patterned mask to the patterned mask holding device;

a membrane coupled to the patterned mask holding device, the membrane being configured to spread vacuum suction from the vacuum patterned mask holding system across a surface area of the patterned mask; and a controller that enables one or both of the first or vacuum patterned mask holding systems based on receiving the result signal.

13. The system of claim 12, wherein the first patterned mask holding system comprises an electrostatic device.

14. The system of claim 13, wherein the membrane includes a metallic coating configured to attract an electric potential generated by the electrostatic system.

15. The system of claim 12, wherein the patterned mask holding device comprises:
 a stage; and
 a chuck coupled to the stage and the patterned mask.

16. The system of claim 15, wherein the chuck is made from zero expansion glass, Zerodur®, or ceramic materials.

17. The system of claim 12, wherein the patterned mask holding device moves at an acceleration of up to 8 G's.

18. The system of claim 12, wherein the membrane is porous.

19. The system of claim 12, wherein the membrane includes channels or grooves configured to be used to spread the vacuum suction from the vacuum patterned mask holding system across the surface area of the patterned mask.

20. The system of claim 12, further comprising:
 a grounding contact coupled to the membrane that is configured to ground the patterned mask.

21. The system of claim 12, wherein the membrane includes alignment devices configured to align the membrane with respect to the patterned mask holding device.

22. A method, comprising:
 (a) holding a patterned mask to a patterned mask holding device using a first holding system;
 (b) holding the patterned mask to the patterned mask holding device using a vacuum holding system concurrently with step (a), while a moving device is moving the patterned mask holding device and the patterned mask during a scanning portion of an exposure operation; and
 (c) spreading vacuum suction from the vacuum patterned mask holding system across a surface area of the patterned mask using a membrane coupled to the patterned mask holding device.

23. The method of claim 22, wherein step (a) comprises: using an electrostatic system as the first holding system.

24. The method of claim 22, further comprising:
 monitoring for slippage of the patterned mask with respect to the patterned mask holding device during the moving; and
 controlling operation of both of the first and vacuum holding systems when the slippage is detected.

25. The method of claim 22, further comprising wherein the moving of the patterned mask holding device and the patterned mask occurs at an acceleration of up to about 8 G's.

* * * * *